(12) United States Patent
Ravi

(10) Patent No.: US 7,384,693 B2
(45) Date of Patent: Jun. 10, 2008

(54) DIAMOND-LIKE CARBON FILMS WITH LOW DIELECTRIC CONSTANT AND HIGH MECHANICAL STRENGTH

(75) Inventor: Kramadhati V. Ravi, Atherton, CA (US)

(73) Assignee: Intel Corporation, Santa Clara, CA (US)

( * ) Notice: Subject to any disclaimer, the term of this patent is extended or adjusted under 35 U.S.C. 154(b) by 200 days.

(21) Appl. No.: 10/835,479

(22) Filed: Apr. 28, 2004

(65) Prior Publication Data

US 2005/0260411 A1    Nov. 24, 2005

(51) Int. Cl.
*B32B 3/26* (2006.01)

(52) U.S. Cl. ............... 428/408; 428/210; 428/336; 428/312.2; 428/314.4; 428/318.6; 428/319.1

(58) Field of Classification Search ............... 428/408, 428/210, 336, 312.2, 314.4, 318.6, 319.1; 257/77

See application file for complete search history.

(56) References Cited

U.S. PATENT DOCUMENTS

| | | | | |
|---|---|---|---|---|
| 5,844,252 A | * | 12/1998 | Shiomi et al. | 257/77 |
| 5,939,732 A | * | 8/1999 | Kurtz et al. | 257/77 |
| 6,083,614 A | * | 7/2000 | Gordeev et al. | 423/446 |
| 6,091,081 A | * | 7/2000 | Matsubara et al. | 257/77 |
| 6,147,407 A | * | 11/2000 | Jin et al. | 257/77 |
| 6,171,691 B1 | * | 1/2001 | Nishibayashi | 428/457 |
| 6,723,635 B1 | * | 4/2004 | Ngo et al. | 438/627 |

FOREIGN PATENT DOCUMENTS

| | | | |
|---|---|---|---|
| EP | 942072 | * | 9/1999 |
| JP | 2002-110870 | * | 4/2002 |
| JP | 2002-289604 | * | 10/2002 |

* cited by examiner

*Primary Examiner*—A. A. Turner
(74) *Attorney, Agent, or Firm*—George Chen

(57) ABSTRACT

The present invention discloses a method including: providing a substrate; and sequentially stacking layers of two or more diamond-like carbon (DLC) films over the substrate to form a composite dielectric film, the composite dielectric film having a k value of about 1.5 or lower, the composite dielectric film having a Young's modulus of elasticity of about 25 GigaPascals or higher.

The present invention further discloses a structure including: a substrate; a porous diamond-like carbon (DLC) film located over the substrate; an opening located in the porous DLC film; and a conductor located in the opening.

11 Claims, 2 Drawing Sheets

DIAMOND-LIKE CARBON FILMS WITH LOW DIELECTRIC CONSTANT AND HIGH MECHANICAL STRENGTH

BACKGROUND OF THE INVENTION

1. Field of the Invention

The present invention relates to the field of semiconductor integrated circuit (IC) manufacturing, and more specifically, to an electrically insulating material with low dielectric constant and high mechanical strength and a method of making such an electrically insulating material.

2. Discussion of Related Art

In 1965 Gordon Moore observed that the pace of technology innovation would result in a doubling of the number of devices per unit area on an IC chip approximately every 18 months. Over the ensuing decades, the semiconductor industry has adhered closely to the schedule projected by Moore's Law for improving device density.

Maintaining such an aggressive schedule for each device generation has required continual enhancements at the corresponding technology node. Devices on a chip are typically fabricated in a substrate from semiconducting material, such as silicon, and electrically insulating material, such as silicon oxide or silicon nitride. Subsequently, the devices may be wired with electrically conducting material, such as copper. The electrically conducting material may be stacked in layers that are separated vertically and horizontally by electrically insulating material.

On the one hand, the additive processes of ion implantation, annealing, oxidation, and deposition had to be improved to produce the requisite doping profiles and film stacks across the chip. On the other hand, the subtractive processes of photolithography and etch also had to be enhanced to shrink the features across the chip while maintaining pattern fidelity.

Photolithography was able to keep up with the reduction in the critical dimension (CD) needed for each device generation. However, improving the resolution that could be achieved often required compromising the depth of focus (DOF). As a result, the smaller DOF made it necessary to minimize the topography across the substrate in which the device was being formed. Planarization of the surface of the substrate with chemical-mechanical polish (CMP) became necessary to fabricate advanced devices.

In order to improve device density, both the transistor in the front-end of semiconductor processing and the wiring in the back-end of semiconductor processing have to be scaled down. The scaling of the transistor and the scaling of the wiring must be carefully balanced to avoid degrading performance or reliability of the chip.

The switching speed of the transistor may be adversely impacted by an excessively large resistance-capacitance (RC) product delay in the wiring. Resistance in the wiring may be reduced by using electrically conducting material with low resistivity. Capacitance in the wiring may be reduced by using electrically insulating material with low dielectric constant (k).

However, the electrically insulating material with low dielectric constant must also have high mechanical strength to withstand the rigors of front-end and back-end of semiconductor processing, as well as, the packaging steps.

Thus, what is needed is an electrically insulating material with low dielectric constant and high mechanical strength and a method of making such an electrically insulating material.

BRIEF DESCRIPTION OF THE DRAWINGS

FIG. 1 F is also an illustration of a cross-sectional view of a structure including a dielectric having low dielectric constant and high mechanical strength.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

Figure 1A:
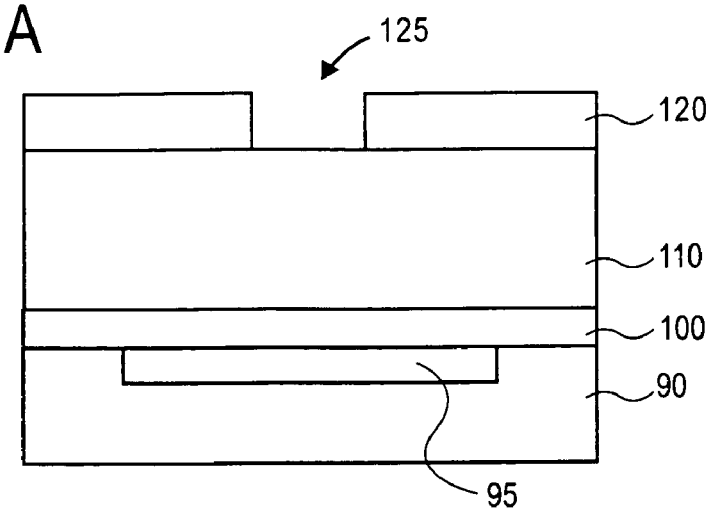
FIGS. 1 A-F are illustrations of a cross-sectional view of an embodiment of a method of forming an electrically insulating material with low dielectric constant and high mechanical strength according to the present invention.
Figure 1B:
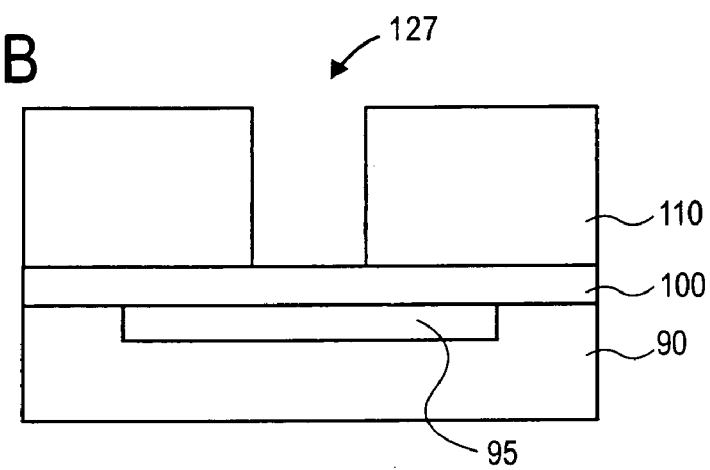
Figure 1C:
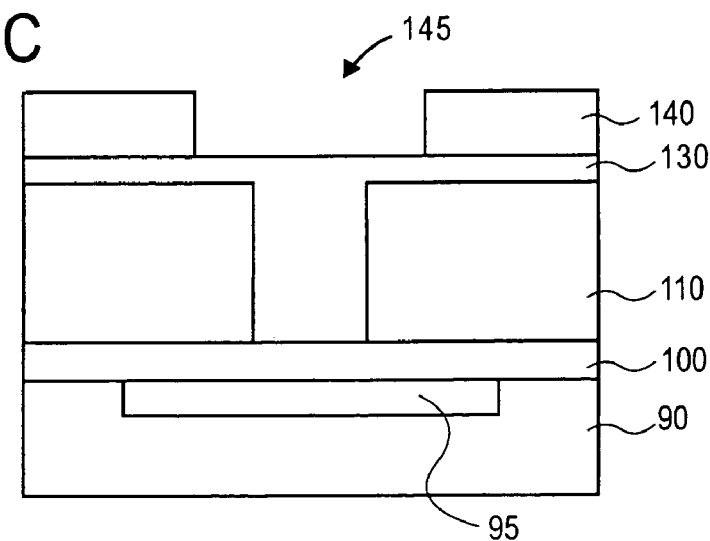
Figure 1D:
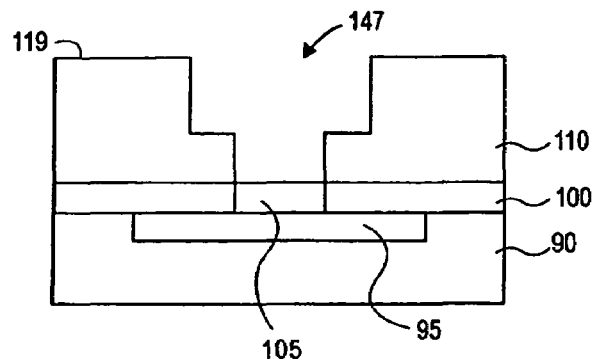
Figure 1E:
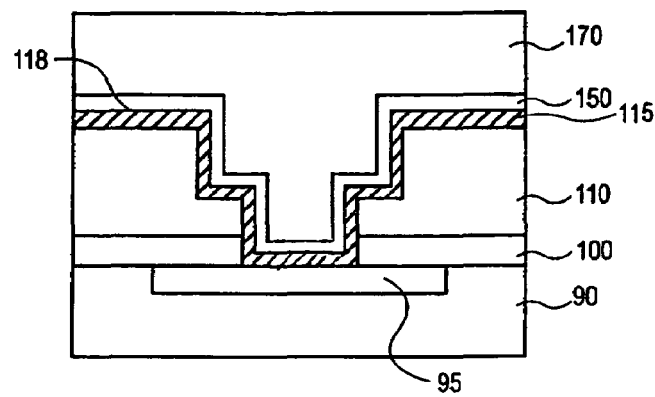
Figure 1F:
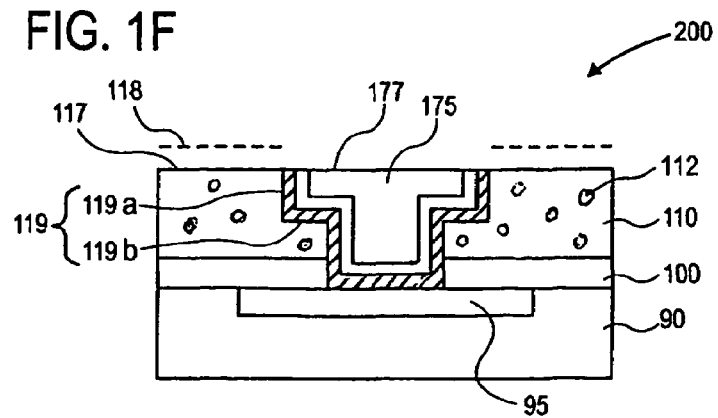

The present invention describes a method of forming a diamond-like carbon film with low dielectric constant and high mechanical strength, such as for insulating interconnects on a chip. Various embodiments of the method of forming a diamond-like carbon film are shown in FIGS. 1 A-F.

The present invention further describes a structure having a diamond-like carbon film with low dielectric constant and high mechanical strength, such as for an interlayer dielectric film on a chip. Various embodiments of the structure having a diamond-like carbon film are shown in FIG. 1 F.

As shown in an embodiment of the present invention in FIG. 1 A, a device 95 may be formed in a substrate 90. The device 95 may be active or passive. The device 95 may include a memory device or a logic device. The substrate 90 may include a semiconducting material, such as silicon.

In an embodiment of the present invention, the substrate 90 may be covered with an etch stop layer 100. The etch stop layer 100 may have a thickness selected from a range of about 20-60 nanometers (nm).

In an embodiment of the present invention, a barrier layer (not shown) may be formed over the etch stop layer 100 to prevent any intermixing or reaction.

Next, an interlayer dielectric (ILD) 110 film of diamond-like carbon (DLC) may be formed over the etch stop layer 100. In an embodiment of the present invention, the ILD 110 film may include a composite dielectric film, such as the DLC. The DLC in the ILD 110 film may have a thickness selected from a range of about 100-500 nm.

In an embodiment of the present invention, the ILD 110 film may be formed by sequentially stacking two or more layers of DLC films to produce a composite dielectric film having appropriate properties and a desired thickness. The layers that are sequentially stacked to form the composite dielectric film may vary in thickness, crystallinity, and porosity.

The first layer of the stack is at the bottom of the ILD 110 film. The odd layers may include the first layer, the third layer, the fifth layer, and so on. The even layers may include the second layer, the fourth layer, the sixth layer, and so on. In an embodiment of the present invention, certain layers, such as the odd layers, may have no pores while other layers, such as the even layers, may have pores. In another embodiment of the present invention, an odd layer is at the top of the ILD 110 film.

In an embodiment of the present invention, the DLC may be formed with a chemical vapor deposition (CVD) process. In the CVD process, precursor molecules in a gas phase may be dissociated, or activated, by an energy source to form active species, such as reactive radicals, ions, or atoms. The active species in the gas phase may react and condense over a solid surface, such as the etch stop layer 100, to form the DLC.

In an embodiment of the present invention, the CVD process may occur at atmospheric pressure (about 760 Torr) or higher with an energy source that may include a combustion flame source, such as an oxyacetylene torch source or a plasma torch source. The plasma torch source may include a Direct Current (DC) plasma arc jet source.

In an embodiment of the present invention, the CVD process may occur at atmospheric pressure (about 760 Torr) or lower with an energy source that may include a thermal source, such as a hot filament (HF) source. The HF source may include a single filament or multiple filaments.

In an embodiment of the present invention, the CVD process may occur at atmospheric pressure (about 760 Torr) or lower with an energy source that may include an electron or ion bombardment source, such as an electrical discharge source or a plasma source.

In an embodiment of the present invention, the ILD 110 film may be formed from DLC by using a plasma-enhanced CVD (PECVD) process. The plasma source may include a radio frequency (RF) plasma source, a microwave (MW) plasma source, an electron cyclotron resonance (ECR) plasma source, a Direct Current (DC) plasma source, or a laser plasma source.

In an embodiment of the present invention, the RF plasma source may be generated by radiation with a frequency of about 13.56 MegaHertz (MHz). In another embodiment of the present invention, the RF plasma source may include an inductively-coupled plasma (ICP) source.

In an embodiment of the present invention, a negative substrate bias of about 40-800 volts DC may be used with the RF plasma source. In another embodiment of the present invention, a negative substrate bias of about 800-3,500 volts DC may be used with the RF plasma source. The substrate bias may be a function of the RF plasma power and the pressure in the reactor. The substrate bias may also depend on the geometry and the dimensions of the reactor. In an embodiment of the present invention, the reactor, or deposition tool, may include parallel plates.

In an embodiment of the present invention, the MW plasma may be generated by radiation with a frequency of about 2.45 GigaHertz (GHz). In another embodiment of the present invention, the MW plasma may be generated by radiation with a frequency of about 915 MHz.

In an embodiment of the present invention, the laser plasma may be generated by radiation with an ultraviolet (UV) wavelength from an excimer laser with multiple pulses.

The process to form the DLC may be selected to produce desired structure and properties for the ILD 110 film. The process parameters for deposition of the ILD 110 film may include source gas flow rate, substrate temperature, reactor pressure, and plasma power (or plasma power density).

In an embodiment of the present invention, the deposition of the ILD 110 film may include a source gas flow rate of about 50-200 standard cubic centimeters per minute (SCCM). In another embodiment of the present invention, the source gas flow rate may be about 200-800 SCCM. In still another embodiment of the present invention, the source gas flow rate may be varied as a function of time.

In an embodiment of the present invention, the deposition of the ILD 110 film may include a substrate temperature of about 200-250 degrees Centigrade. In another embodiment of the present invention, the deposition of the ILD 110 film may include a substrate temperature of about 250-400 degrees Centigrade. In still another embodiment of the present invention, the deposition of the ILD 110 film may include a substrate temperature of about 400-850 degrees Centigrade. In yet another embodiment of the present invention, the deposition of the ILD 110 film may include a substrate temperature of about 850 degrees Centigrade or higher.

In an embodiment of the present invention, the deposition of the ILD 110 film may include a pressure of about 0.001-20 Torr. In another embodiment of the present invention, the deposition of the ILD 110 film may include a reactor pressure of about 20-250 Torr. In still another embodiment of the present invention, the deposition of the ILD 110 film may include a reactor pressure of about 250-760 Torr. In yet another embodiment of the present invention, the deposition of the ILD 110 film may include a reactor pressure of about 760 Torr or higher.

In an embodiment of the present invention, the deposition of the ILD 110 film may include a plasma power of about 1-10 kilowatts (kW). In another embodiment of the present invention, the plasma power may be about 10-100 kW. In an embodiment of the present invention, the plasma power may be pulsed on and off as a function of time. In another embodiment of the present invention, the plasma power may be varied as a function of time.

In an embodiment of the present invention, the plasma power density may be about 0.1-0.5 Watts per square centimeter (W/cm2). In another embodiment of the present invention, the plasma power density may be about 0.5-2.5 W/cm2.

Nucleation and growth of the lattice of the DLC may depend on the underlying layer over which the ILD 110 film is being formed. In an embodiment of the present invention, the underlying layer may be the etch stop layer 100. In another embodiment of the present invention, the underlying layer may be the substrate 90. In still another embodiment of the present invention, the underlying layer may be the barrier layer (not shown). If the underlying layer includes silicon, an intermediate layer such as beta-SiC, with a thickness such as several nanometers, may be formed.

In an embodiment of the present invention, the underlying layer may be pretreated prior to deposition. In another embodiment of the present invention, plasma treatment may be used to increase the roughness of the surface of the underlying layer to increase the deposition rate.

The deposition rate of the DLC may depend on the process parameters. In an embodiment of the present invention, the deposition rate for the ILD 110 film may be about 0.5-4.0 nm/minute. In another embodiment of the present invention, the deposition rate for the ILD 110 film may be about 4.0-30.0 nm/minute. In still another embodiment of the present invention, the deposition rate for the ILD 110 film may be about 30.0-250.0 nm/minute.

In an embodiment of the present invention, the process to form the ILD 110 film may be alternated between a deposition step to form a lattice for the DLC and a modification step to change the lattice of the DLC. The process of alternating between the deposition step and the modification step may be repeated until a desired thickness for the ILD 110 film is achieved. The ILD 110 film may include a composite dielectric film, such as the DLC. The DLC in the ILD 110 film may have a thickness selected from a range of about 100-500 nm.

In an embodiment of the present invention, the deposition step and the modification step may occur in the same chamber of the deposition tool. In another embodiment of the present invention, the deposition step and the modification step may occur in separate chambers of the deposition tool.

The characteristics of the DLC in the ILD 110 film may be modified by choice of precursors in the source gas stream for the deposition step. Atomic carbon may be provided by a carbonaceous source. In an embodiment of the present invention, the carbonaceous source may include a hydrocarbon, R—H. In another embodiment of the present invention, the carbonaceous source may include a substituted hydrocarbon, X—R—H. In still another embodiment of the present invention, the carbonaceous source may include a chlorohydrocarbon, Cl—R—H. In yet another embodiment of the present invention, the carbonaceous source may include a chloromethane, such as CCl4, CHCl3, or CH2Cl2.

Additives may be included in the source gas stream for the deposition step if desired. Additives in the source gas stream for the deposition step may include nitrogen or Argon. In an embodiment of the present invention, a small amount of nitrogen, such as about 2.5 parts per trillion (ppt) may increase the deposition rate of the DLC in the ILD 110 film by a factor of 2. In another embodiment of the present invention, nitrogen may reduce intrinsic stress in the DLC in the ILD 110 film. The intrinsic stress in the DLC is usually compressive.

Additives may change the morphology or texture of the DLC in the ILD 110 film by affecting the kinetics of the active species (such as the reactive radicals, ions, or atoms) for adsorption to, desorption from, and diffusion over the surface of the underlying layer. In an embodiment of the present invention, additives may affect the degree of crystallinity of the DLC. The DLC may be separated by grain boundaries into clusters, regions, or domains, of various sizes that are single-crystalline, nanocrystalline, polycrystalline, or amorphous. In another embodiment of the present invention, additives may introduce voids and facets.

In an embodiment of the present invention, the structure and the properties of the DLC, as a function of depth (z-position) in the ILD 110 film, may be optimized by customizing, or tailoring, the process parameters in situ. In another embodiment of the present invention, the process parameters may be changed in discrete steps during formation of the ILD 110 film. In still another embodiment of the present invention, the process parameters may be varied continuously during formation of the ILD 110 film.

In an embodiment of the present invention, the process parameters may be selected to favor formation of sp3 bonds, with a tetrahedral coordination, between carbon atoms to produce a 3-dimensional network of predominantly diamond forms of carbon in the structure of the ILD 110 film.

In another embodiment of the present invention, the process parameters may be selected to favor formation of sp2 bonds, or double bonds, with a planar coordination, between carbon atoms to produce weakly-bonded 2-dimensional networks of predominantly non-diamond forms of carbon, such as graphite, in the structure of the ILD 110 film.

In still another embodiment of the present invention, the process parameters may be selected to favor formation of aromatic carbon rings, or multi-membered carbon rings. The multi-membered carbon rings may be mostly six-membered carbon rings, with some five-membered carbon rings and some seven-membered carbon rings.

In yet another embodiment of the present invention, the process parameters may be selected to favor formation of sp1 bonds.

In an embodiment of the present invention, the ILD 110 film may be modified by creating pores in the lattice of the DLC. Each pore may include one or more discontinuities, voids, and defects. The defects may include interstitials and vacancies. The interstitials refer to the carbon atoms that have been displaced from the sites in the lattice. The vacancies refer to the sites in the lattice that have not been occupied by any carbon atom. The defects may also include microtwins, dislocations, stacking faults, and amorphous regions.

The DLC in the ILD 110 film may be modified by choice of precursors in the source gas stream for the modification step. The modification step may include etching. In an embodiment of the present invention, etching may result from atomic hydrogen provided by a hydrogen source, such as hydrogen gas, H2. Atomic hydrogen in the plasma stabilizes the diamond forms of carbon by selectively etching the non-diamond forms of carbon. The non-diamond forms of carbon may include graphite, aromatic carbon rings, multi-membered carbon rings, and defective carbon materials. In an embodiment of the present invention, atomic hydrogen may etch the non-diamond forms of carbon about 2-5 times faster than the diamond forms of carbon.

In an embodiment of the present invention, etching may result from atomic oxygen. In another embodiment of the present invention, etching may result from molecular oxygen. In still another embodiment of the present invention, etching may result from atomic fluorine. Additives may also be included in the source gas stream for the modification step if desired.

The composition of the source gas stream may be varied between the deposition step and the modification step to achieve the desired material properties for the DLC in the ILD 110 film. The relative durations of the deposition step and the modification step may also be adjusted.

In an embodiment of the present invention, the composition of the source gas stream may be varied between a higher R—H/H2 ratio for the deposition step and a lower R—H/H2 ratio for the modification step. A higher R—H/H2 ratio favors formation of sp3 bonds, with a tetrahedral coordination, between carbon atoms to produce diamond forms of carbon. A lower R—H/H2 ratio favors formation of sp2 bonds, with a planar coordination, between carbon atoms to produce non-diamond forms of carbon. The non-diamond forms of carbon may include graphite, aromatic carbon rings, multi-membered carbon rings, and defective carbon materials.

In an embodiment of the present invention, R may be CH3 so R—H may be CH4 or methane. In an embodiment of the present invention, the deposition step may include a source gas, with a small amount of CH4 in H2 by volume, for a duration of about 60 seconds to form a thin layer having a high concentration of non-diamond forms of carbon, as well as, defects. In an embodiment of the present invention, the modification step may include a source gas of about 100% H2 by volume for a duration of about 30 seconds to selectively etch the non-diamond forms of carbon within the lattice of the DLC. The non-diamond forms of carbon that may be deposited and etched may include graphite, aromatic carbon rings, multi-membered carbon rings, and defective carbon materials. The defects may include interstitials and vacancies. The defects may also include microtwins, dislocations, stacking faults, and amorphous regions.

In an embodiment of the present invention, the source gas for deposition includes about 0.1-1.0% CH4/H2 by volume. In another embodiment of the present invention, the source gas for deposition includes about 1.0-2.0% CH4/H2 by volume. In still another embodiment of the present invention, the source gas for deposition includes about 2.0-5.0% CH4/H2 by volume.

The properties of the ILD 110 film may include the dielectric constant, or k value, and the Young's modulus of elasticity. The DLC, in the bulk and without pores, may have a k value of about 5.5-6.7 and a Young's modulus of elasticity of about 800-1,200 GPa. In an embodiment of the present invention, the DLC may be used to form an ILD 110 film with appropriate properties if pores 112 may be introduced into the DLC to sufficiently reduce the effective k value for the ILD 110 film while adequately maintaining the mechanical strength for the ILD 110 film.

The pores 112 may be created in-situ in the ILD 110 film. The pores 112 may be filled with a material, such as a gas, with a low k value. In an embodiment of the present invention, the gas may include air with a k value of about 1.0. In another embodiment of the present invention, the gas may include hydrogen. In another embodiment of the present invention, the gas may include nitrogen.

The effective k value of the ILD 110 film depends upon the nominal k value of the bulk material forming the ILD 110 film and the nominal k value of the material, if present, filling the pores 112, weighted by the total porosity of the ILD 110 film. The effective k value for the ILD 110 film should be reduced as the design rules for the device 95 are decreased.

In an embodiment of the present invention, the ILD 110 film may have a k value of about 2.5 or lower. In another embodiment of the present invention, the ILD 110 film may have a k value of about 2.0 or lower. In still another embodiment of the present invention, the ILD 110 film may have a k value of about 1.5 or lower. The k value may be determined by measuring capacitance on a parallel-plate electrical structure.

The ILD 110 film should possess high mechanical strength so as to withstand the stresses induced by processing, such as at the wafer level, the chip level, and the package level. Young's modulus of elasticity is a measurement of the mechanical strength of a material. In an embodiment of the present invention, the ILD 110 film may have a Young's modulus of elasticity of about 25 GPa or higher.

Shear strength is another measurement of the mechanical strength of a material. The shear strength of the ILD 110 film should be sufficient to withstand the CMP process that may be used to planarize the conductor layer 170, as shown in an embodiment in FIG. 1 F. In an embodiment of the present invention, the ILD 110 film may have a shear strength of about 15 GPa or higher.

Fracture toughness is yet another measurement of the mechanical strength of a material. In an embodiment of the present invention, the ILD 110 film may have a high fracture toughness.

The mechanical strength of the ILD 110 film may depend upon several factors, such as the total porosity, the local porosity, the pore 112 size (such as, the equivalent diameter), and the pore 112 size distribution across the ILD 110 film. The mechanical strength of the ILD 110 film may also depend upon the density of the ILD 110 film.

Total porosity is the pore fraction by volume and may vary from zero to one. In an embodiment of the present invention, the total porosity of the ILD 110 film may be selected from a range of about 0.15-0.30. In another embodiment of the present invention, the total porosity of the ILD 110 film may be selected from a range of about 0.30-0.45. In still another embodiment of the present invention, the total porosity of the ILD 110 film may be selected from a range of about 0.45-0.60. In yet another embodiment of the present invention, the total porosity of the ILD 110 film may be selected from a range of about 0.60-0.75.

In an embodiment of the present invention, a high total porosity, such as about 0.60-0.75, may reduce mechanical strength and barrier layer coverage. In another embodiment of the present invention, a high total porosity, such as about 0.60-0.75, may increase surface roughness and line-edge roughness (LER).

The local porosity of the ILD 110 film may vary for a given total porosity. In an embodiment of the present invention, the local porosity may vary by location (x-position and y-position) within the plane of the ILD 110 film. In another embodiment of the present invention, the local porosity may vary as a function of depth (z-position) in the ILD 110 film.

The pores 112 in the ILD 110 film may be closed, interconnected, or open. The closed pores may include voids with internal surfaces that are spread around a nominal center. In an embodiment of the present invention, closed pores may be small with an equivalent diameter that is selected from a range of about 2-6 nm. In another embodiment of the present invention, closed pores may be medium with an equivalent diameter that is selected from a range of about 6-18 nm. In still another embodiment of the present invention, closed pores may be large with an equivalent diameter that is selected from a range of about 18-55 nm.

The interconnected pores may include two or more closed pores that have merged together. In an embodiment of the present invention, the pores may start transitioning from closed pores to interconnected pores at a total porosity of about 0.30 or higher. In another embodiment of the present invention, the pores may start transitioning from closed pores to interconnected pores at a total porosity of about 0.45 or higher.

The open pores may include pores that have intersected external surfaces of the ILD 110 film. Open pores may trap contaminants, especially those that are liquid or gaseous. The contaminants may affect function, operation, performance, or reliability of the device 95 in the substrate 90.

The open pores may also reduce the surface area for adhesion at an interface between the ILD 110 film and an underlying or overlying layer. The reduced surface area may decrease interfacial bonding strength and may result in delamination or cracking, especially when a mismatch in coefficient of thermal expansion (CTE) exists among the materials in the vicinity of the interface.

In an embodiment of the present invention, the CTE may be about 1-3 parts per million per degree Kelvin (ppm/K) for the DLC in the ILD 110 film, about 2-7 ppm/K for the substrate 90 and the etch stop layer 100, and about 12-23 ppm/K for the conductor layer 170. In another embodiment of the present invention, the CTE of the DLC in the ILD 110 film may be matched closely with the CTE for the substrate 90 and the etch stop layer 100.

An embodiment of a variation of a via-first process flow for a dual Damascene scheme will be described next. However, different embodiments of the present invention are compatible with other process flows, such as a variation of a trench-first process flow for a dual Damascene scheme.

After formation of DLC for the ILD 110 film, the processes of photolithography and etch are used to pattern a via 127, as shown in an embodiment in FIGS. 1 A-B. A radiation-sensistive material, such as a via-layer photoresist 120, may be applied over the ILD 110 film. Then, a portion of the via-layer photoresist 120 is exposed to radiation of an appropriate wavelength and dose. The exposure is performed in an imaging tool, such as a wafer stepper or a wafer scanner. A via-layer reticle may be placed in the optical path of the radiation to determine the portion of the via-layer photoresist 120 that is to be exposed. Exposure is followed by development of the via-layer photoresist 120 to create a via-layer mask.

The via-layer mask includes a via feature 125 that corresponds to the exposed portion of the via-layer photoresist 120, as shown in an embodiment in FIG. 1 A. The shape and critical dimension (CD) of the via feature 125 in the via-layer photoresist 120 is derived from a design on the via-layer reticle. In an embodiment of the present invention, the photoresist 120 may have a thickness of about 100 nm and the via feature 125 may have a CD of about 65 nm.

The via feature 125 patterned in the via-layer photoresist 120 may be transferred into the ILD 110 by a dry etch process, as shown in an embodiment in FIG. 1 B. A dry etch process, such as a plasma etch process or a reactive ion etch process (RIE), may be used to etch a via 127 completely through the ILD 110 film. The formation of the via 127 may involve precleans and postcleans associated with the etch. The etch stop layer 100 under the ILD 110 film allows a longer over-etch to clean out the bottom of the via 127 without breaking through and damaging the underlying conductor 95.

High directionality is desired for the via 127 etch when the narrowest portion of the via 127 has a large aspect ratio (depth:width), such as about 6:1 or greater. In one embodiment, a high density plasma, such as an RF ICP, may be used.

The dry etch of the ILD 110 film to form the via 127 may be performed with a gas mixture. The gas mixture for etching an ILD 110 film formed from DLC may include oxygen, O2. Other gases that may be used for via 127 etch include H2O. The etch rate of the ILD 110 film may be selected from a range of about 15-120 nm/minute.

The etch selectivity of the ILD 110 film to the via-layer photoresist 120 may be higher than about 3:1. If the etch selectivity is not sufficiently large, additional processing complexity may be required, such as including a hard mask (not shown) that will not be eroded during dry etch of the ILD 110 film.

After via 127 etch, the via-layer photoresist 120 is removed. If desired, the via 127 etch and the strip of the via-layer photoresist 120 may be done sequentially in an integrated tool.

The etch stop layer 100 is thick enough to prevent the via 127 etch from breaking through to damage the underlying device 95 in the substrate 90.

After formation of the via 127, the processes of photolithography and etch are used to pattern a trench. A bottom anti-reflective coating (BARC) 130 may be formed over the ILD 110 film and in the via 127, as shown in an embodiment in FIG. 1 C. Then, a trench-layer photoresist 140 is applied over the BARC 130. The BARC 130 will minimize any exposure problem in the vicinity of the via 127 that may be caused by swing-curve effects from the thickness variation in the trench-layer photoresist 140 by light-scattering effects from the step-height change in the ILD 110 film. The BARC 130 also minimizes further etch of the via 127 during the subsequent etch of the trench.

Then, the trench-layer photoresist 140 is exposed using radiation of the appropriate wavelength and dose. The exposure is performed in an imaging tool, such as a wafer stepper or a wafer scanner, and modulated by a trench-layer reticle. Exposure is followed by development of a trench feature 145 in the trench-layer photoresist 140.

The trench feature 145 in the trench-layer photoresist 140 is superimposed over the via 127 etched into the ILD 110 film. The shape and CD of the trench feature 145 is derived from a design on the trench-layer reticle. In an embodiment of the present invention, the BARC 130 may have a thickness of about 35 nm, the photoresist 140 may have a thickness of about 100 nm, and the trench feature 145 may have a CD of about 65 nm.

A dry etch process, such as a plasma etch process or an RIE process, may be used to partially etch the ILD 110 film to form a trench over the via 127, as shown in an embodiment in FIG. 1 D. High directionality is desired for the trench etch when the narrowest portion of the trench—via opening 147 has a large aspect ratio (depth:width), such as about 6:1 or greater. In one embodiment, a high-density plasma, such as an RF ICP, may be used for the trench etch.

The dry etch of the ILD 110 film to form the combined trench—via opening 147 may be performed with a gas mixture. The gas mixture for etching an ILD 110 film formed from DLC may include oxygen, O2. Other gases that may be used for trench etch include H2O. The etch rate of the ILD 110 film may be selected from a range of about 15-120 nm/minute.

The etch selectivity of the ILD 110 film to the trench-layer photoresist 140 may be higher than about 3:1. If the etch selectivity is not sufficiently large, additional processing complexity may be required, such as including a hard mask (not shown) that will not be eroded during dry etch of the ILD 110 film.

After etching the trench—via opening 147 in the ILD 110 film, the trench-layer photoresist 140 and the underlying BARC 130 are removed. If desired, the trench etch and the strip of the trench-layer photoresist 140 and the BARC 130 may be done sequentially in an integrated tool.

Then, the portion of the etch stop layer 100 underlying the trench—via opening 147, as shown in an embodiment in FIG. 1 D, is removed, such as by a dry etch. The underlying conductor 95 should not be damaged by the removal of the portion of the etch stop layer 100 below the trench—via opening 147.

As shown in an embodiment in FIG. 1 E, a barrier layer 115 is formed over the ILD 110 film and in the trench—via opening 147. Copper may be used for the conductor layer 170 to be formed later in the trench—via opening 147. Copper has a high diffusivity so the barrier layer 150 must encapsulate the sides and the bottom of the trench—via opening 147 to prevent diffusion of Copper into the ILD 110 film and the device connected to the underlying conductor 95. Otherwise, Copper may introduce mid-gap states into the semiconductor material forming the device and degrade carrier lifetime.

The barrier layer 115 may be formed from a metal, including a refractive metal, such as Tantalum (Ta), or an alloy, such as Titanium-Tungsten (TiW), or a ceramic, such as Tantalum-Nitride (TaN), Tantalum-Silicon-Nitride (TaSiN), Titanium-Nitride (TiN), or Tungsten-Nitride (WN). The barrier layer 150 may have a thickness selected from a range of about 5-20 nm.

In one embodiment, the barrier layer 115 may include a lower layer of TaN to adhere to the underlying ILD 110 film and an upper layer of Ta to adhere to the overlying seed layer 150. A barrier layer 115 formed from a Ta/TaN bilayer may have a total thickness selected from a range of about 8-15 nm.

High directionality is desired for forming the barrier layer 115, especially when the narrowest portion of the trench—via opening 147 has a large aspect ratio (depth:width), such as about 6:1 or greater. The technique of ionized physical vapor deposition (I-PVD) may be used to form a material with better step coverage than other techniques, such as collimation sputtering or long-throw sputtering (LTS).

In certain cases, a MOCVD process may be used to form the barrier layer 115. Alternatively, the barrier layer 115 may be formed using atomic-layer deposition (ALD), especially for a thickness of about 10 nm or less. ALD may provide good step coverage and good thickness uniformity even while permitting the use of a low deposition temperature, such as of about 200-400 degrees Centigrade.

When the trench—via opening 147 is to be filled later by electroplating a conductor layer 170, a seed layer 150 should first be formed over the barrier layer 115, as shown in an embodiment in FIG. 1 E. In order to serve as a base for electroplating, the seed layer 150 must be electrically conductive and continuous over the barrier layer 115. Adhesion loss of the seed layer 150 from the underlying barrier layer 115 should be prevented. Interfacial reaction of the seed layer 150 with the underlying barrier layer 115 should also be prevented.

The seed layer 150 may be formed from the same or different material as the conductor layer 170 to be formed later. For example, the seed layer 150 may include a metal, such as Copper, or an alloy. The seed layer 150 may have a thickness selected from a range of about 10-20 nm.

The seed layer 150 may be deposited by I-PVD, especially when the conductor layer 170 is to be formed later by electroplating. If desired, the barrier layer 115 and the seed layer 150 may be sequentially deposited in a tool, without breaking vacuum, so as to prevent formation of an undesirable interfacial layer between the barrier layer 115 and the seed layer 150.

When the conductor layer 170 is to be subsequently formed by PVD, better material properties and surface characteristics may be achieved for the conductor layer 170 if the seed layer 150 is formed using CVD. The seed layer 150 may also be formed with ALD or electroless plating.

Next, the trench—via opening 147 may be filled with a conductor layer 170 to make electrical contact with the underlying device 95, as shown in an embodiment in FIG. 1 F. The conductor layer 170, such as a metal, may be formed over the seed layer 150 by an electrochemical process, such as electroplating or electrofilling. The conductor layer 170 may have a thickness that provides an overburden of about 400 nm above the ILD 110 film.

In other embodiments, the conductor layer 170 may be formed with a PVD process or a CVD process. A PVD process or a CVD process may be particularly advantageous when forming the conductor layer 170 over a trench—via opening 147 that has a large aspect ratio (depth:width), such as about 6:1 or greater. A PVD process usually has a lower Cost-of-Ownership (CoO) than a CVD process. In some cases, a MOCVD process may also be used.

The conductor layer 170 may be treated after being formed to modify its material properties or surface characteristics. The treatment may include a rapid thermal anneal (RTA) process after deposition to modify or stabilize grain size. For example, Copper that has been formed by electroplating may have a grain size of about 50-10,000 nm, depending upon the thickness, deposition conditions, and anneal conditions. A larger grain size usually corresponds to a lower resistivity which is more desirable. For example, Copper may have a resistivity of about 1.7-2.5 micro-ohm-centimeter (uohm-cm) at 20 degrees Centigrade.

A as shown in an embodiment in FIG. 1 F, a chemical-mechanical polishing (CMP) process may be used to remove the overburden of the conductor layer 170 and the portion of the barrier layer 115 over an upper surface 117 of the ILD 110 film. The CMP process to create an inlaid interconnect 175 in the trench—via opening 147 may be optimized depending upon the polish rates of different materials. Polish selectivity to different materials may be optimized by changing the properties of the polish pad, the properties of the polish slurry, and the parameters of the polish tool.

The process of CMP combines abrasion and dissolution to flatten and smoothen surface relief. Abrasion occurs when higher portions of the surface contact a pad and abrasive particles in a slurry and become subject to mechanical forces. Dissolution occurs when materials at the surface contact chemicals in the slurry and become subject to chemical or electrochemical reactions.

In one embodiment, the slurry may include an abrasive and a complexing agent. The abrasive may include particles, such as Alumina ($Al_2O_3$) or Silica ($SiO_2$), while the complexing agent may include a chemical, such as Ammonium Hydroxide ($NH_4OH$) or Potassium Hydroxide (KOH). A relatively soft pad may be used to prevent the generation of defects. A final buff may be used to remove scratches.

In a first embodiment, the CMP process involves three polishes. The first polish removes most of the overburden of the conductor layer 170. The second polish planarizes the remaining conductor layer 170 over the barrier layer 115. The polish rate of the conductor layer 170 in the first polish and the second polish may be selected from a range of about 90-1,300 nm/minute. The third polish removes the portion of the barrier layer 115 over the upper surface 117 of the ILD 110 film.

In a second embodiment, the CMP process involves two polishes. The first polish removes all of the overburden of the conductor layer 170 and planarizes the conductor layer 170 over the barrier layer 115. The second polish removes the portion of the barrier layer 115 over the upper surface 117 of the ILD 110 film.

In a third embodiment, the CMP process involves one polish to remove all of the overburden of the conductor layer 170 and remove the portion of the barrier layer 115 over the upper surface 117 of the ILD 110 film.

The CMP process should not cause the ILD 110 to fracture or delaminate due to excessive stress. After the CMP process, an upper surface 177 of the inlaid interconnect 175 should be approximately flat and level with the upper surface 117 of the ILD 110 film.

After planarization with CMP, an etch stop layer may be formed over the upper surface 177 of the inlaid interconnect 175 and the upper surface 117 of the ILD 110 film. In some cases, the etch stop layer may also serve as a capping layer to prevent diffusion, intermixing, or reaction of the inlaid interconnect 175 with the surrounding materials.

A process sequence analogous to the embodiment shown in FIG. 1 A-F may be repeated to form the next higher layer of inlaid interconnect. In a dual Damascene scheme, each layer includes a via and an overlying trench. The total number of layers of interconnect may depend on whether the device 95 is a memory device or a logic device. The total number of layers of interconnect may also depend on the design rules for the device 95. In an embodiment of the present invention, a total of 7-10 layers may be formed for a logic device with 65-nm design rules.

The present invention also discloses a structure 200 having an interlayer dielectric (ILD) 110 film that includes diamond-like carbon (DLC), an opening located in the DLC; and an inlaid interconnect 175 located in the opening. The ILD 110 film may include a composite dielectric film, such as the DLC. In an embodiment of the present invention, the DLC in the ILD 110 film may have a thickness of about 100-500 nm. The opening may include a via with an overlying trench. The inlaid interconnect 175 may include a metal, such as copper, or an alloy. An embodiment of the present invention is shown in FIG. 1 F.

The DLC may include pores 112. In an embodiment of the present invention, the total porosity, or void fraction, of the DLC may be about 0.15-0.30. In another embodiment of the present invention, the total porosity of the DLC may be about 0.30-0.45. In still another embodiment of the present invention, the total porosity of the DLC may be about 0.45-0.60. In yet another embodiment of the present invention, the total porosity of the DLC may be about 0.60-0.75.

The pores 112 in the DLC may be closed, interconnected, or open. In an embodiment of the present invention, closed pores may be small with an equivalent diameter of about 2-6 nm. In another embodiment of the present invention, closed pores may be medium with an equivalent diameter of about 6-18 nm. In still another embodiment of the present invention, closed pores may be large with an equivalent diameter of about 18-55 nm.

In an embodiment of the present invention, the porous DLC may have a k value of about 2.5 or lower. In another embodiment of the present invention, the porous DLC may have a k value of about 2.0 or lower. In still another embodiment of the present invention, the porous DLC may have a k value of about 1.5 or lower.

In an embodiment of the present invention, the porous DLC may have a Young's modulus of elasticity of about 25 GPa or higher. In another embodiment of the present invention, the porous DLC may have a shear strength of about 15 Gpa or higher. In another embodiment of the present invention, the porous DLC may have a high fracture toughness.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, and so forth, described herein. It is to be understood that the detailed description of the present invention should be taken as illustrative and not limiting, wherein the scope of the present invention should be determined by the claims that follow.

Thus, we have described a method of forming an electrically insulating material with low dielectric constant and good mechanical strength and a structure including a dielectric having low dielectric constant and good mechanical strength.

I claim:

1. A structure comprising:
   a substrate;
   a porous diamond-like carbon (DLC) film disposed over said substrate, said porous DLC film comprising odd layers with no pores and even layers with pores, said pores being closed pores, said pores filled with nitrogen, said nitrogen to reduce intrinsic stress in said porous DLC film wherein an odd layer is at a top of said porous DLC film and said intrinsic stress is compressive;
   an opening disposed in said porous DLC film; and
   a conductor disposed in said opening.

2. The structure of claim 1 wherein said porous DLC film comprises a total porosity of about 0.60-0.75.

3. The structure of claim 1 wherein said porous DLC film comprises closed pores with an equivalent diameter of about 2-6 nm.

4. The structure of claim 1 wherein said porous DLC film comprises a thickness of about 100-500 nanometers.

5. The structure of claim 1 wherein said porous DLC film comprises a k value of about 1.5 or lower.

6. The structure of claim 1 wherein said porous DLC film comprises a Young's modulus of elasticity of about 25 GigaPascals or higher.

7. The structure of claim 1 wherein said porous DLC film comprises a shear strength of about 15 GigaPascals or higher.

8. The structure of claim 1 wherein said porous DLC film comprises diamond forms of carbon.

9. The structure of claim 1 wherein said porous DLC film comprises non-diamond forms of carbon.

10. The structure of claim 1 wherein said porous DLC film comprises aromatic carbon rings and multi-membered carbon rings.

11. The structure of claim 1 wherein said DLC film comprises discontinuities, voids, and defects.

\* \* \* \* \*